United States Patent [19]

Endo et al.

[11] 4,399,015

[45] Aug. 16, 1983

[54] METHOD FOR FABRICATING AN INDIUM TIN OXIDE FILM FOR A TRANSPARENT ELECTRODE

[75] Inventors: Yoshihiro Endo; Yoshito Yamashita; Hiroshi Kishishita, all of Nara; Hisashi Uede, Wakayama, all of Japan

[73] Assignee: Sharp Kabushiki Kaisha, Osaka, Japan

[21] Appl. No.: 344,520

[22] Filed: Feb. 1, 1982

[30] Foreign Application Priority Data

Feb. 3, 1981 [JP] Japan .................................. 56-15410

[51] Int. Cl.$^3$ .............................................. C23C 15/00
[52] U.S. Cl. .................................. 204/192 P; 204/298
[58] Field of Search ...................................... 204/192 P

[56] References Cited

U.S. PATENT DOCUMENTS 3,749,658 7/1973 Vossen ............................ 204/192 P
4,010,291 3/1977 Katsube et al. ................. 204/192 P

OTHER PUBLICATIONS

Fan International Patent Publication No. WO80/00713.
Thornton et al., J. Vac. Sci. Technol. 13 (1976) pp. 117–121.
Hoffman et al., App. Phys. 16 (1978) pp. 381–390.
Motzen, J. Vac. Sci. Technol. 12 (1975) pp. 99–101.

Primary Examiner—Arthur P. Demers
Attorney, Agent, or Firm—Birch, Stewart, Kolasch & Birch

[57] ABSTRACT

A method for fabricating an indium tin oxide (ITO) film comprises depositing the ITO film on a heat-resisting substrate by sputtering using a metal alloy target of In-Sn in an atmosphere including an active gas, and heat-treating the ITO film at about 550–650 degrees Centigrade in an oxygen-free atmosphere. Preferably, the heat-resisting substrate comprises an aluminoborosilicate glass. Further, sputtering, preferably reactive sputtering, is employed.

10 Claims, No Drawings

METHOD FOR FABRICATING AN INDIUM TIN OXIDE FILM FOR A TRANSPARENT ELECTRODE

BACKGROUND OF THE INVENTION

The present invention relates to a method for preparing a transparent electrode used for a display and, more particularly, to a method for fabricating an indium tin oxide film suitable for a transparent electrode for a display device such as a thin-film electroluminescent display panel.

The indium tin oxide (ITO) film comprises $In_2O_3$ as the principal constituent containing $SnO_2$. The ITO film is used as a transparent, conductive film because of its low resistivity and high transparency. It can be widely used as a transparent electrode for a thin-film electroluminescent display panel, a liquid crystal display, an electrochromic display cell, etc.

Recently, the ITO film has been fabricated by the following sputtering methods depending on the type of target as summarized in Table I.

TABLE I

| Target | Methods of Sputtering |
|---|---|
| Oxide ($In_2O_3$ + $SnO_2$) | D.C. Sputtering |
| " | R.F. Sputtering |
| Metal (In + Sn) | D.C. Sputtering |
| " | R.F. Sputtering |

Among these sputtering methods, reactive sputtering methods for applying a D.C. voltage in an atmosphere of active gases (Ar+$O_2$) using the metal target are preferable considering the cost of the target and the apparatus. In particular, D.C. planar magnetron sputtering as the reactive sputtering is most preferable since it allows a wide selection of pressures by the sputtering gas, improves the sputtering rate, and is suited for straight-line deposition from the target to the substrate and, thus, for mass production.

However, disadvantageously, the D.C. sputtering methods using the metal target are poor in reproducibility of the ITO film. Therefore, it is desired to improve the reproducibility of the ITO film.

SUMMARY OF THE INVENTION

Accordingly, it is an object of the present invention to provide an improved method for fabricating an ITO film for use in a display such as a thin-film electroluminescent display panel.

Briefly described, in accordance with the present invention, a method for fabricating an indium tin oxide (ITO) film comprises depositing the ITO film on a heat-resisting substrate by sputtering using a metal alloy target of In-Sn in an atmosphere including an active gas, and heat-treating the ITO film at about 550-650 degrees Centigrade in an oxygen-free atmosphere. Preferably, the heat-resisting substrate comprises aluminoborosilicate. Further, sputtering, preferably reactive sputtering, is achieved.

DESCRIPTION OF THE INVENTION

An indium tin oxide (ITO) film is prepared by a reactive sputtering method using a metal alloy target (In+Sn) in an atmosphere including active gases (Ar+$O_2$). In this case, the sputtering rate greatly depends critically on the partial pressure of $O_2$.

More particularly, when there is a low partial pressure of $O_2$, oxidation at the target surface becomes slow so as to provide a fast sputtering rate, so that the sputtering film cannot be oxidized. When there is a high partial pressure of $O_2$, oxidation at the target surface becomes fast so as to provide a slow sputtering rate, so that the sputtering film is almost fully oxidized and shows a high resistance.

Therefore, a moderate partial pressure of $O_2$ is selected to provide a highly transparent and a low-resistant film because the moderate partial pressure enables the production of a suitable oxygen-defect film. Preferably, the partial pressure of $O_2$ is set in the range of $1 \times 10^{-4} - 1 \times 10^{-3}$ Torr depending on the sputtering condition.

However, as a matter of fact, it is very difficult to accurately control the partial pressure of $O_2$.

The characteristics of the sputtered film depend on the temperature of the substrate used during sputtering. As the temperature rises, the characteristics become satisfactory. However, the substrate cannot be heated at about 400 degrees Centigrade. Therefore, conventionally, the ITO film obtained by sputtering must be heat-treated or annealed. Conventionally, the annealing temperature is set in the range of 300-400 degrees Centigrade.

The heat treatment on the ITO film according to the present invention can remedy the deviation in the resistance and the transparency owing to the variation of the partial pressure of $O_2$. It thus becomes unnecessary to exactly control the partial pressure of $O_2$ with the help of the present invention.

The following shows a relation between the film properties and the annealing temperature. The sputtered film was formed on a heat-resisting substrate, preferably made of glass. The annealing was conducted under vacuum. The following data were obtained with the reactive sputtering using the D.C. planar magnetron sputtering methods.

| Just After Sputtering | | |
|---|---|---|
| Sample | Specific Resistance | Transmittance |
| A | $6.5 \times 10^{-4}$ ohm cm | 64.0% |
| B | $4.2 \times 10^{-4}$ | 86.2 |
| C | $7.1 \times 10^{-4}$ | 88.0 |
| After Annealing at about 400 degrees Centigrade | | |
| Sample | Specific Resistance | Transmittance |
| A | $4.0 \times 10^{-4}$ ohm cm | 77.2% |
| B | $1.7 \times 10^{-4}$ | 89.5% |
| C | $2.8 \times 10^{-4}$ | 89.7 |
| After Annealing at about 600 degrees Centigrade | | |
| Sample | Specific Resistance | Transmittance |
| A | $1.7 \times 10^{-4}$ ohm cm | 88.0% |
| B | $1.7 \times 10^{-4}$ | 90.2 |
| C | $1.9 \times 10^{-4}$ | 91.0 |

The transmittance was measured with a combination including the substrate and the sputtered film. The glass substrate only showed a transmittance of about 94-95%. The thickness of the substrate was about 2.3 mm. The transmittance was measured with light having a wavelength of 530 mm. The thickness of the ITO film was about 1,500 Angstroms. The annealing lasted for about 30 minutes.

Sample B was a sputtered film prepared in a preferable partial pressure of $O_2$. Sample B showed a good specific resistance and a good transmittance. Sample B was improved of annealing, but the improvement of Sample B did not depend as critically on the annealing temperature.

Sample A was a sputtered film prepared in a partial pressure of $O_2$ lower than the preferable one. Sample C was a sputtered film prepared in a partial pressure of $O_2$ higher than the preferable one. Sample A showed a low transmittance. Sample C showed a high resistance. Samples A and C could be improved by the annealing at about 600 degrees Centigrade rather than those by the annealing at about 400 degrees Centigrade.

Thus, annealing at about 600 degrees Centigrade can uniform the sputtered film characteristics so as to assure the reproducibility. Preferably, the annealing is performed at about 550-650 degrees Centigrade. Below this temperature range, the effect by the annealing cannot be expected. Above this temperature range, the ITO film may decompose. The annealing can be performed in an oxygen-free atmosphere such as Ar gas in place of the above-mentioned vacuum condition.

Preferably, an aluminoborosilicate glass is selected as such a heat-resisting substrate for supporting the ITO film to form a display device. The aluminoborosilicate glass belongs to the group of borosilicate glasses, but has a raised temperature of a strain ponit of about 650 degrees Centigrade or more since it contains a large amount of alumina elements. One example of this type of glass is produced and sold by Hoya Electronics Co. Ltd. (Japan) as LE-30 having a strain point of 650 degrees Centigrade.

Normally, the aluminoborosilicate glass can resist the effect of heat up to about 550-650 degrees Centigrade applied to the ITO film.

According to the present invention, the heat-treatment of the ITO film at about 550-650 degrees Centigrade is essential. Therefore, the method by which the ITO film is fabricated can be freely selected and, for example, from D.C. sputtering and R.F. sputtering as long as reactive sputtering is carried out.

The invention being thus described, it will be obvious that the same way be varied in many ways. Such variations are not to be regarded as a departure from the spirit and the scope of the invention, and such modifications are intended to be included within the scope of the following claims.

What is claimed is:

1. A method for fabricating an indium tin oxide (ITO) film, comprising:

depositing the ITO film on a heated substrate which is heat-resistant by sputtering using a metal alloy target of In-Sn in an atmosphere including an active gas having a moderate partial pressure of oxygen; and heat-treating the ITO film at about 550°-650° C. in an oxygen-free atmosphere.

2. The method of claim 1, wherein the heat-resistant substrate comprises an aluminoborosilicate glass.

3. The method of claim 1, wherein the sputtering of the ITO film is effected by reaction sputtering.

4. The method of claim 3, wherein the sputtering of the ITO film is effected by D.C. planar magnetron sputtering.

5. A product produced by the method of claim 1.

6. A product produced by the method of claim 2.

7. A product produced by the method of claim 3.

8. A product produced by the method of claim 4.

9. The method of claim 1, wherein the active gas includes argon and oxygen.

10. The method of claim 1, wherein the partial pressure of oxygen is about $1 \times 10^{-4}$ to $1 \times 10^{-3}$ Torr.

* * * * *